(12) United States Patent
Chuang

(10) Patent No.: US 6,469,912 B1
(45) Date of Patent: Oct. 22, 2002

(54) ELECTRICAL APPARATUS HAVING A COVER MEMBER ADAPTED TO PROVIDE ELECTROMAGNETIC INTERFERENCE SHIELDING TO AN ELECTRONIC COMPONENT

(75) Inventor: Wei-Pin Chuang, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 09/987,865

(22) Filed: Nov. 16, 2001

(51) Int. Cl.$^7$ .................................. H05K 9/00
(52) U.S. Cl. ...................... 361/816; 361/752; 361/759; 361/800; 361/801; 361/818; 174/35 R
(58) Field of Search ................. 361/752, 759, 361/800, 801, 799, 816, 81, 814, 818; 174/35 R, 51

(56) References Cited

U.S. PATENT DOCUMENTS 5,508,889 A * 4/1996 Ii .......................... 174/35 R
5,748,455 A * 5/1998 Phillips et al. ............ 174/35 R \* cited by examiner Primary Examiner—Jayprakash N. Gandhi
(74) Attorney, Agent, or Firm—Foley & Lardner

(57) ABSTRACT

An electrical apparatus includes a circuit board received in a housing and mounted removably with an electronic component thereon. The circuit board has a set of ground contacts disposed around the electronic component. The housing has a wall portion formed with an access opening to permit access to the electronic component on the circuit board. A cover member includes a dielectric cover plate mounted detachably on the housing so as to cover the access opening. The cover plate is mounted with a conductive grounding plate that is formed integrally with a set of contacts extending into the housing via the access opening so as to establish electrical contact with the ground contacts on the circuit board when the cover member covers the access opening. The ground contacts and the grounding plate cooperate to provide electromagnetic interference shielding to the electronic component.

3 Claims, 4 Drawing Sheets

ELECTRICAL APPARATUS HAVING A COVER MEMBER ADAPTED TO PROVIDE ELECTROMAGNETIC INTERFERENCE SHIELDING TO AN ELECTRONIC COMPONENT

FIELD OF THE INVENTION

The invention relates to an electrical apparatus, more particularly to an electrical apparatus having a cover member that is adapted to provide electromagnetic interference shielding to an electronic component.

DESCRIPTION OF THE RELATED ART

The design of notebook computers has a current trend toward compactness. In order to ensure enhanced performance for a notebook computer, an expandsion slot for additional memory modules can be found in the notebook computer. Memory modules are getting smaller in size. At present, the specifications of 144-pin and 0.8-mm pin distance for a SODIMM memory are now being replaced by 200-pin and 0.6-mm pin distance. Therefore, it is important to provide electromagnetic interference shielding to a memory module especially during high-frequency operation.

FIG. 1 illustrates a conventional notebook computer that includes housing 1 and a cover member 2. The housing 1 has a circuit board 12 received therein. The circuit board 12 is mounted removably with a memory module 13 thereon via a slot 121 that is mounted on the circuit board 12. With further reference to FIG. 2, the circuit board 12 has a set of ground contacts 122, such as solder pads, that are disposed around the slot 121 on the circuit board 12. Each of the ground contacts 122 is provided with a resilient hook-shaped conductive piece 123 that is soldered thereon. The housing 1 further has a wall portion 10 formed with an access opening 11 to permit access to the memory module 13 on the circuit board 12. The wall portion 10 has an inner surface with a conductive first grounding plate 111 mounted thereon. The first grounding plate 111 is formed with a flange 112 that extends radially and inwardly relative to the access opening 11. The flange 112 contacts directly the conductive piece 123 so as to establish electrical contact with the ground contacts 122. The cover member 2 includes a dielectric cover plate 20 mounted detachably on the housing 1 so as to cover the access opening 11. The cover plate 20 has an inner surface with a conductive second grounding plate 21 mounted thereon. The second grounding plate 21 is provided with a set of contacts 211 that extend through the access opening 11 so as to establish electrical contact with the flange 112 of the first grounding plate 111 when the cover member 2 covers the access opening 11. As such, the contacts 211 of the second grounding plate 21 establish electrical contact with the ground contacts 122 via the flange 112 of the first grounding plate 111 and the conductive pieces 123. Therefore, the ground contacts 122, the flange 112 and the contacts 211 can cooperate to provide electromagnetic interference shielding to the memory module 13.

The following are some of the drawbacks of the aforesaid conventional notebook computer:

1. Due to the use of the conductive pieces 123 that are soldered to the ground contacts 122, the requisite material and additional soldering process for the conductive pieces 123 result in higher costs.
2. Since the conductive pieces 123 are hook-shaped, the conductive pieces 123 are easily deformed during assembly such that the conductive pieces 123 cannot provide good electrical contact with the flange 112 of the first grounding plate 111, thereby resulting in inferior electromagnetic interference shielding.

SUMMARY OF THE INVENTION

Therefore, the object of the present invention is to provide an electrical apparatus having a cover member that is adapted to provide superior electromagnetic interference shielding to an electronic component without incurring a substantial increase in costs.

According to the present invention, an electrical apparatus comprises:

a housing having a circuit board received therein, the circuit board being adapted to be mounted removably with an electronic component thereon, and having a set of ground contacts that are disposed around the electronic component on the circuit board, the housing further having a wall portion formed with an access opening to permit access to the electronic component on the circuit board, the wall portion having an inner surface with a conductive first grounding plate mounted thereon, the first grounding plate being formed with a flange that extends radially and inwardly relative to the access opening; and a cover member including a dielectric cover plate mounted detachably on the housing so as to cover the access opening, the cover plate having an inner surface with a conductive second grounding plate mounted thereon, the second grounding plate being provided with a set of first contacts that extend through the access opening so as to establish electrical contact with the flange of the first grounding plate when the cover member covers the access opening, the second grounding plate being further provided with a set of second contacts that extend into the housing via the access opening so as to establish electrical contact with the ground contacts on the circuit board when the cover member covers the access opening;

the ground contacts, the flange, and the first and second contacts cooperating to provide electromagnetic interference shielding to the electronic component.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
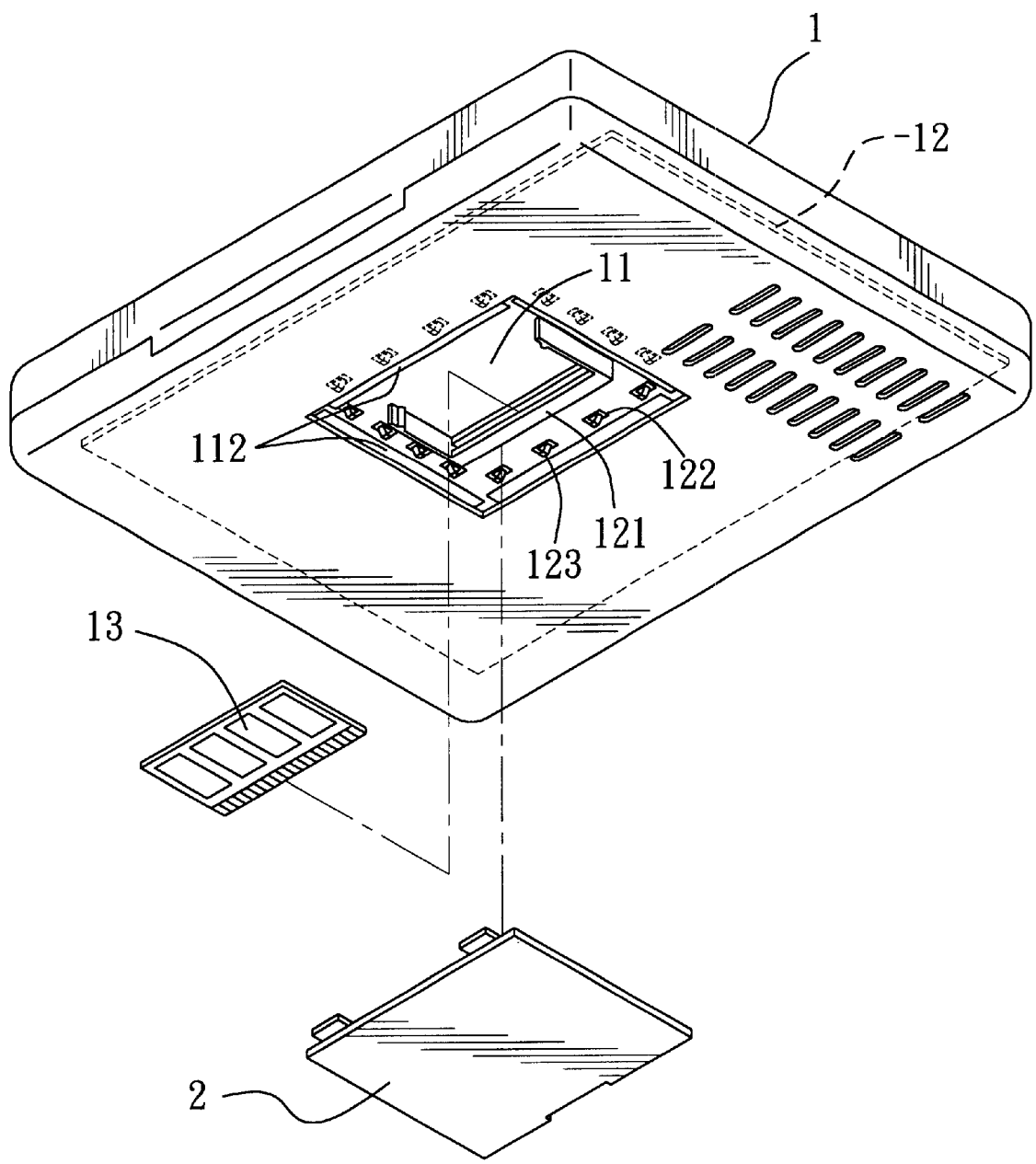
FIG. 1 is an exploded bottom perspective view of a conventional notebook computer.
Figure 2:
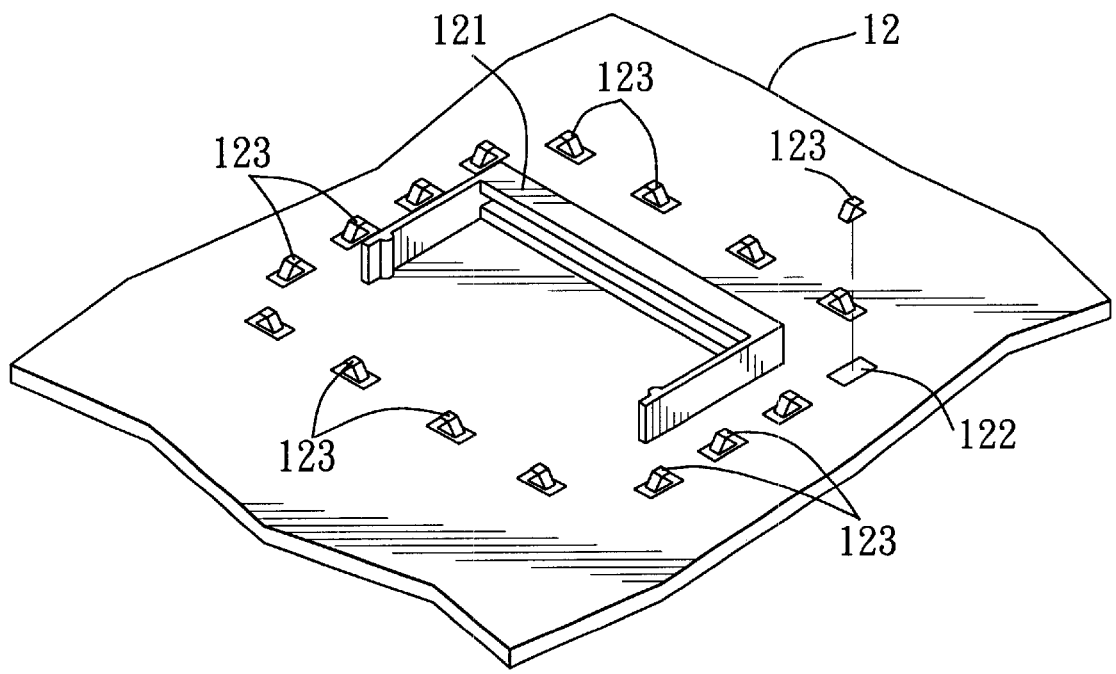
FIG. 2 is a fragmentary perspective view of a circuit board of the conventional notebook computer.
Figure 3:
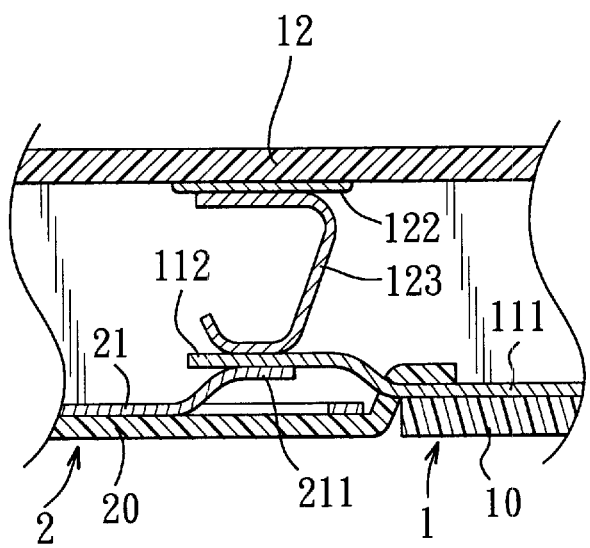
FIG. 3 is a fragmentary schematic sectional view of the conventional notebook computer.
Figure 4:
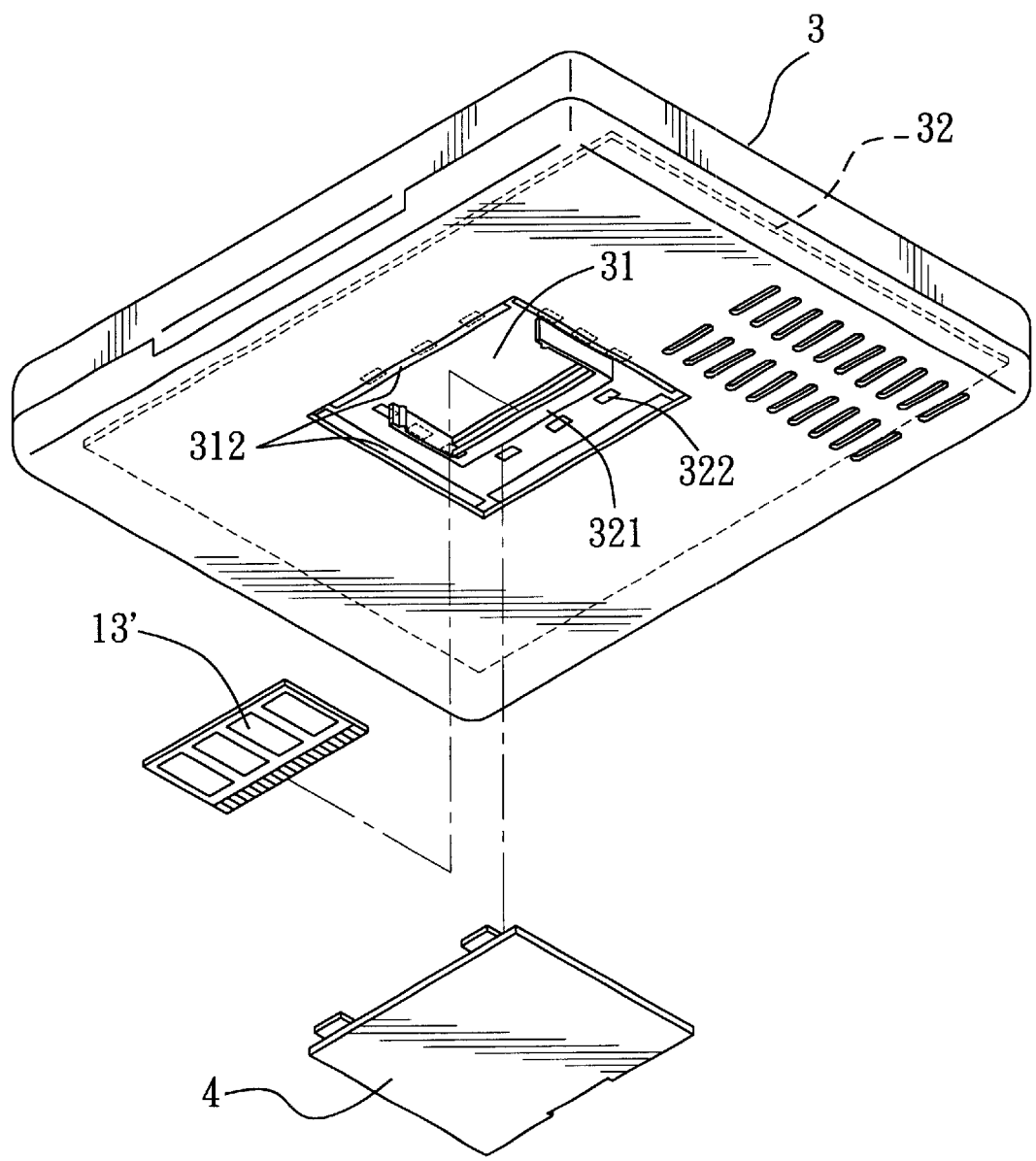
FIG. 4 is an exploded bottom perspective view showing the preferred embodiment of a notebook computer according to the present invention.
Figure 5:
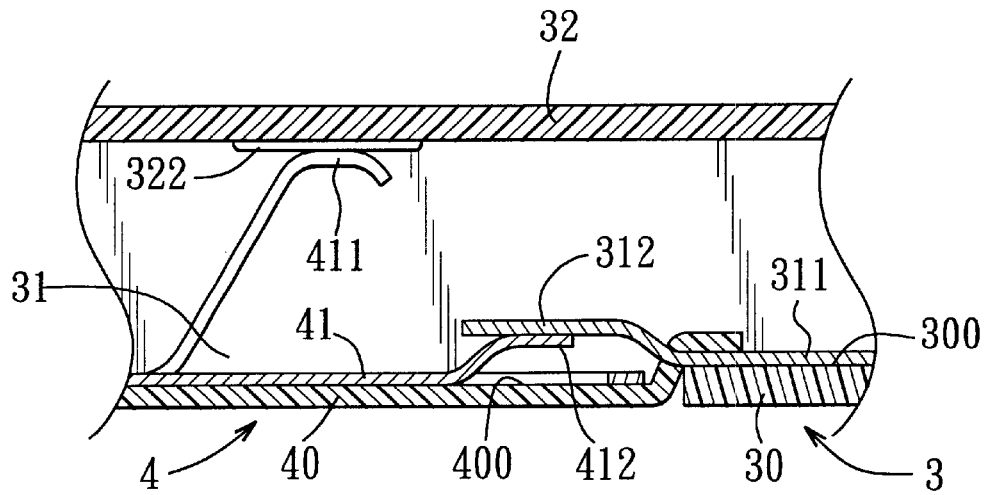
FIG. 5 is a fragmentary schematic sectional view of the preferred embodiment.

Referring to FIGS. 4 and 5, the preferred embodiment according to the present invention is shown to be embodied in a notebook computer that includes a housing 3 and a cover member 4.

The housing 3 has a circuit board 32 received therein. The circuit board 32 is adapted to be mounted removably with an electronic component 13', such as a memory module, thereon via a slot 321 that is mounted on the circuit board 32, and has a set of ground contacts 322 that are disposed around the electronic component 13' on the circuit board 32. The housing 3 further has a wall portion 30 formed with an access opening 31 to permit access to the electronic component 13' on the circuit board 32. The wall portion 30 has an inner surface 300 with a conductive first grounding plate 311 mounted thereon. The first grounding plate 311 is formed with a flange 312 that extends radially and inwardly relative to the access opening 31.

Figure 6:
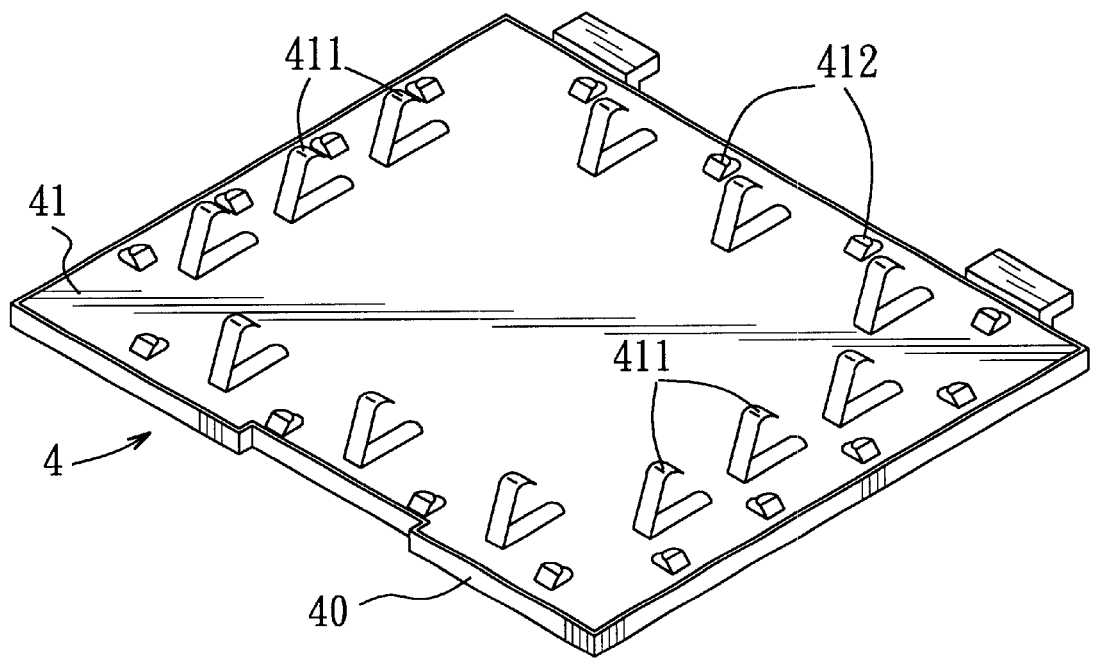
FIG. 6 is a perspective view showing a cover member of the preferred embodiment.

With further reference to FIG. 6, the cover member 4 includes a dielectric cover plate 40 mounted detachably on the housing 3 so as to cover the access opening 31. The cover plate 40 has an inner surface 400 with a conductive second grounding plate 41 mounted thereon. The second grounding plate 41 is provided with a set of first contacts 412 that extend through the access opening 31 so as to establish electrical contact with the flange 312 of the first grounding plate 311 when the cover member 4 covers the access opening 31. The second grounding plate 41 is further provided with a set of second contacts 411 that extend into the housing 30 via the access opening 31 so as to establish electrical contact with the ground contacts 322 on the circuit board 32 when the cover member 4 covers the access opening 31. In this embodiment, the first and second contacts 412, 411 are resilient contacts that are formed integrally with the second grounding plate 41 by punching.

It is noted that the ground contacts 32, the flange 312, and the first and second contacts 412, 411 can cooperate to provide electromagnetic interference shielding to the electronic component 13'. Furthermore, because the second contacts 411 are formed integrally with the second grounding plate 41 by punching, and are in direct contact with the ground contacts 322, the conductive pieces used in the aforesaid prior art can be omitted so as to result in lower costs and in a superior electromagnetic interference shielding effect to the electronic component 13'. The object of the invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. An electrical apparatus, comprising:

a housing having a circuit board received therein, said circuit board being adapted to be mounted removably with an electronic component thereon, and having a set of ground contacts that are disposed around the electronic component on said circuit board, said housing further having a wall portion formed with an access opening to permit access to the electronic component on said circuit board, said wall portion having an inner surface with a conductive first grounding plate mounted thereon, said first grounding plate being formed with a flange that extends radially and inwardly relative to said access opening; and a cover member including a dielectric cover plate mounted detachably on said housing so as to cover said access opening, said cover plate having an inner surface with a conductive second grounding plate mounted thereon, said second grounding plate being provided with a set of first contacts that extend through said access opening so as to establish electrical contact with said flange of said first grounding plate when said cover member covers said access opening, said second grounding plate being further provided with a set of second contacts that extend into said housing via said access opening so as to establish electrical contact with said ground contacts on said circuit board when said cover member covers said access opening;

said ground contacts, said flange, and said first and second contacts cooperating to provide electromagnetic interference shielding to the electronic component.

2. The electrical apparatus as claimed in claim 1, wherein said first and second contacts are resilient contacts that are formed integrally with said second grounding plate by punching.

3. An electrical apparatus, comprising:

a housing having a circuit board received therein, said circuit board being adapted to be mounted removably with an electronic component thereon, and having a set of ground contacts that are disposed around the electronic component on said circuit board, said housing further having a wall portion formed with an access opening to permit access to the electronic component on said circuit board; and a cover member including a dielectric cover plate mounted detachably on said housing so as to cover said access opening, said cover plate having an inner surface with a conductive grounding plate mounted thereon, said grounding plate being formed integrally with a set of contacts that extend into said housing via said access opening so as to establish electrical contact with said ground contacts on said circuit board when said cover member covers said access opening;

said ground contacts and said grounding plate cooperating to provide electromagnetic interference shielding to the electronic component.

* * * * *